(12) United States Patent  
Tong

(10) Patent No.: US 7,939,381 B2
(45) Date of Patent: May 10, 2011

(54) METHOD OF SEMICONDUCTOR PACKAGING AND/OR A SEMICONDUCTOR PACKAGE

(75) Inventor: Soon Hock Tong, Melaka (MY)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/503,604

(22) Filed: Jul. 15, 2009

(65) Prior Publication Data

US 2009/0278250 A1 Nov. 12, 2009

Related U.S. Application Data

(63) Continuation of application No. PCT/SG2007/000013, filed on Jan. 16, 2007.

(51) Int. Cl.
*H01L 21/00* (2006.01)
(52) U.S. Cl. ......... 438/123; 438/106; 438/112; 438/126
(58) Field of Classification Search ................... 438/106, 438/112, 123, 126, 127
See application file for complete search history.

(56) References Cited

U.S. PATENT DOCUMENTS

| 6,084,309 | A * | 7/2000 | Kawashima et al. | 257/778 |
|---|---|---|---|---|
| 6,462,424 | B1 * | 10/2002 | Seki et al. | 257/778 |
| 6,828,688 | B2 | 12/2004 | Yagi | |
| 7,227,249 | B1 * | 6/2007 | Chiang | 257/686 |
| 2004/0130007 | A1 | 7/2004 | Hsu et al. | |
| 2005/0023658 | A1 | 2/2005 | Tabira et al. | |
| 2005/0156291 | A1 * | 7/2005 | Shiu et al. | 257/666 |
| 2005/0156296 | A1 | 7/2005 | Wang et al. | |
| 2006/0231933 | A1 * | 10/2006 | Cabahug et al. | 257/666 |
| 2007/0262423 | A1 * | 11/2007 | Dimaano et al. | 257/667 |

FOREIGN PATENT DOCUMENTS

| EP | 1 189 279 A1 | 3/2002 |
|---|---|---|
| JP | 8-116015 A | 5/1996 |
| JP | 8-288324 A | 11/1996 |
| JP | 11-68005 A | 3/1999 |
| JP | 2000-196005 A | 7/2000 |
| JP | 2001-313362 A | 11/2001 |

* cited by examiner

*Primary Examiner* — Matthew C Landau
*Assistant Examiner* — James M Mitchell
(74) *Attorney, Agent, or Firm* — Slater & Matsil, L.L.P.

(57) ABSTRACT

The method includes forming a leadframe. The leadframe is directly bonded to the semiconductor chip. The leadframe is flexed and/or compressed in a mold cavity. The compressed leadframe and the chip are molded into a package.

18 Claims, 8 Drawing Sheets

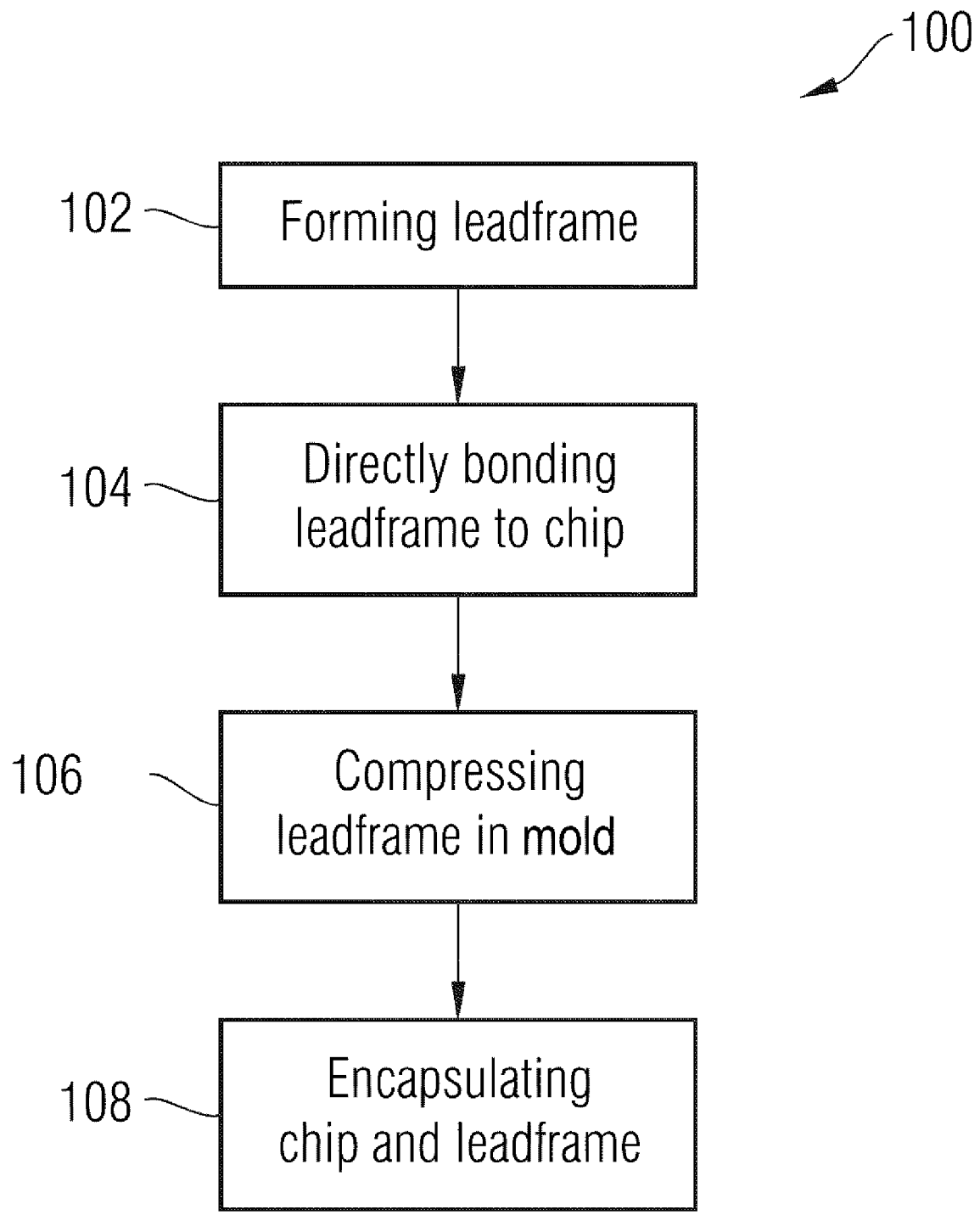

METHOD OF SEMICONDUCTOR PACKAGING AND/OR A SEMICONDUCTOR PACKAGE

This application is a continuation of co-pending International Application No. PCT/SG2007/000013, filed Jan. 16, 2007, which designated the United States and was published in English and is incorporated herein by reference.

BACKGROUND

The present invention relates generally to a method of packaging a semiconductor device and a semiconductor package and in particular embodiments, to such a method of packaging semiconductor device configured for dual sided cooling.

Packaging of a semiconductor device has at least two steps. First, a leadframe is connected to the semiconductor device for mechanical support and electrical connection. Secondly, the leadframe and the semiconductor device are molded to create the package. For example, a dual sided cooling package has a portion of the semiconductor device exposed on one side of the package, and a portion of the leadframe exposed on the opposite side. This allows heat transfer from both sides of the package, which improves thermal management.

A conventional leadframe package having dual sided cooling is described with respect to FIG. 5A. Referring to FIG. 5A, a two step interconnect process is used to fabricate the leadframe 500. In the first step, a chip 502 is attached to diepad 504 with either solder or adhesive 510. In the second step, the chip 502 is attached to leads 520 with either solder or adhesive 510. A mold 530 is filled in to form the leadframe 500.

A conventional flip chip package having dual sided cooling is described with respect to FIG. 5B. Referring to FIG. 5B, the chip 502 is attached to the leads 520 with solder 562. A mold 530 is filled in to form the flip chip package 550.

Referring to FIGS. 5A and 5B, the height h cannot be accurately controlled due to variation in thicknesses of each component, which has a deleteriously impact during subsequent molding process to form mold 530. However, the height of the molding cavity is fixed. If the height h is lower than a height of the mold cavity, a molding process forms mold flashes covering the leads 520. Removing the mold flashes to expose the leads 520 creates variation in package thickness. Alternatively, if the height h is higher than the height of the mold cavity, the chip 502 may be damaged during compression of the mold cavity during the molding process.

BRIEF DESCRIPTION OF THE DRAWINGS

One or more exemplary embodiments will now be described for the sake of example only with reference to the drawings, in which:

FIG. 1 is a flow diagram of a method of packaging according to an exemplary embodiment;

DETAILED DESCRIPTION OF EXEMPLARY EMBODIMENTS

Figure 2A:
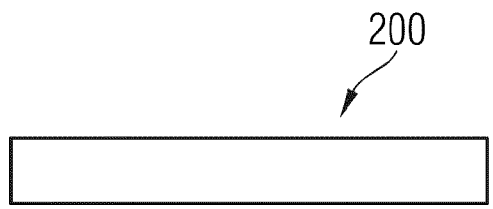
FIGS. 2A-2D are schematic diagrams of leadframe forming in FIG. 1.

FIG. 1 shows a method of packaging 100, according to an exemplary embodiment. The method 100 includes forming a leadframe (leadframe forming 102). The leadframe is directly bonded to the semiconductor chip (leadframe bonding 104). The leadframe is flexed and/or compressed in a mold cavity (leadframe compression 106). The compressed leadframe and the chip are molded/encapsulated into a package (molding 108).

Figure 2B:
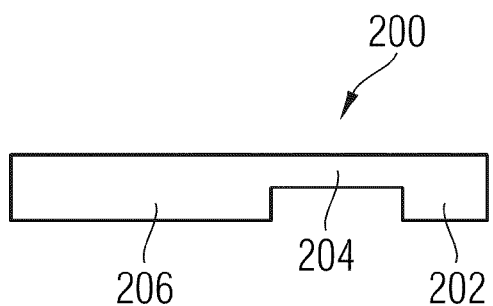
Figure 2C:
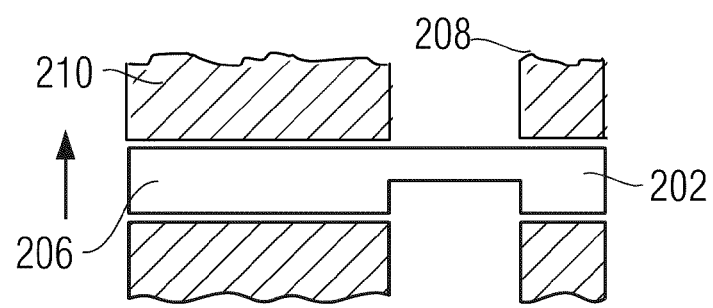
Figure 2D:
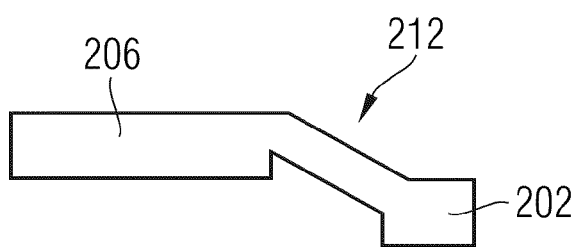

Leadframe forming 102 may be implemented according to the method shown in FIGS. 2A-2D. In FIG. 2A one lead 200 of the leadframe is shown in its initial state. In FIG. 2B the lead 200 has a connecting portion 204 formed between a chip contact portion 202, and an external lead portion 206. The connecting portion 204 is formed by etching the lead 200 to a reduced thickness or cross-sectional area. The reduced thickness or cross-sectional area may be half the original thickness or cross-sectional area. The reduction may vary from the half factor depending on the leadframe characteristic. For example, the reduced thickness of each lead in the connecting portion may be on the upper side or lower side. In FIG. 2C the chip contact portion 202 is located within a clamp 208 and the external lead portion 206 is located in a separate clamp 210. The clamps 208, 210 are translated, so that the chip contact portion 202 and the external lead portion 206 have spaced but parallel longitudinal axes, while the connecting portion 204 becomes nonparallel. For example, the neck portion may be angled in the range 10°-80°, for example, 45°, to the longitudinal axis of the external lead portion 206 or the chip contact portion 202.

Figure 3A:
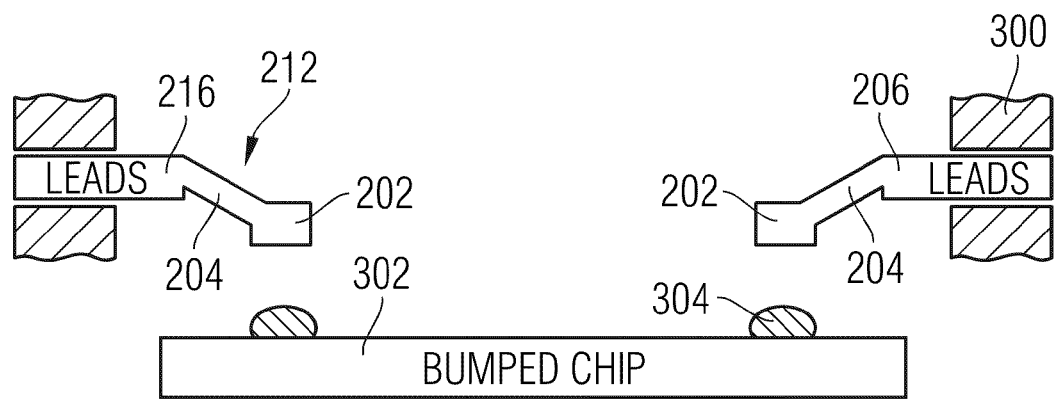
FIGS. 3A-3D are schematic diagrams of leadframe bonding in FIG. 1.
Figure 3B:
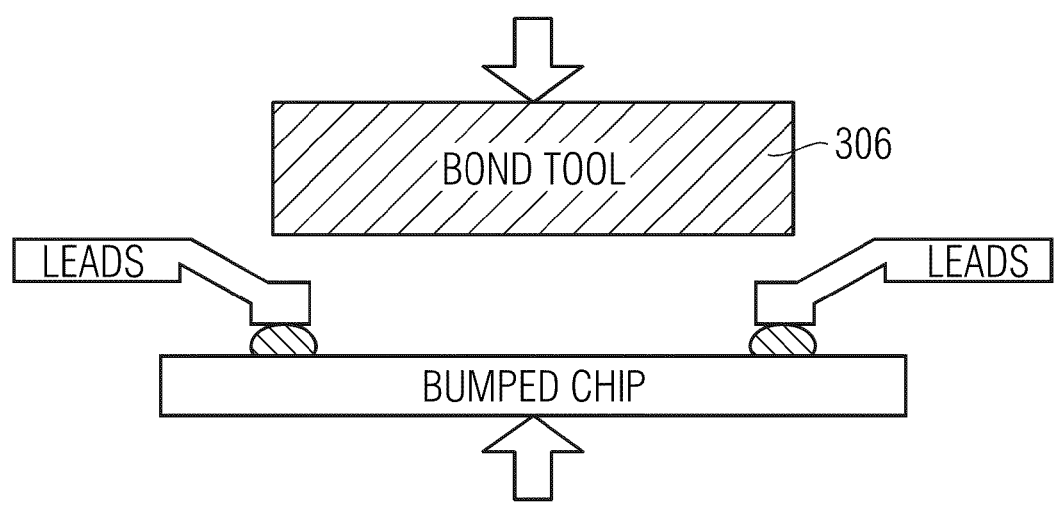
Figure 3C:
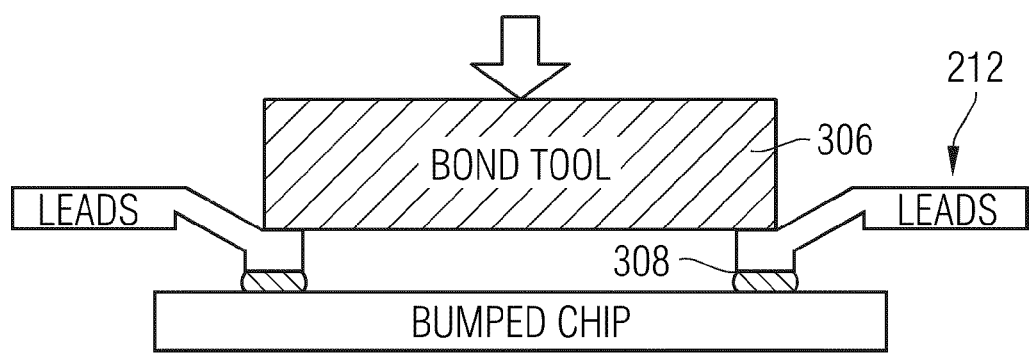
Figure 3D:
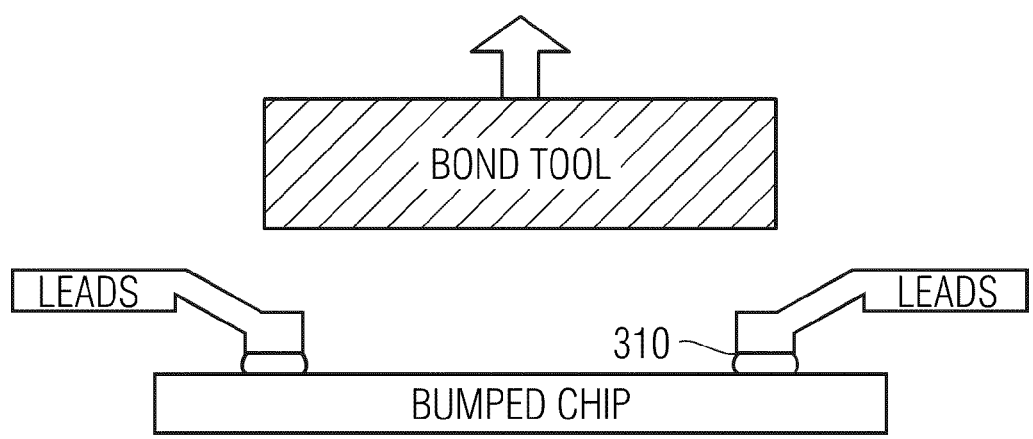

Leadframe bonding 104 may be implemented according to the method shown in FIGS. 3A-3D. In FIG. 3A each lead of the leadframe 212 is held by clamps 300 in alignment with the chip 302, so that each chip contact portion 202 will contact a corresponding solder ball 304. In FIG. 3B the chip 302 is brought into contact with the leadframe 212, and a bonding tool 306 is brought into contact with the other side of the leadframe 212. In FIG. 3C the bonding tool 306 heats the connection 308 between each chip contact portion 202 and a corresponding solder ball 304, until thermo-mechanical bonding occurs. In FIG. 3D the leadframe 212 has been directly bonded 310 to the chip 302, and the bonding tool 306 is retracted.

Figure 4A:
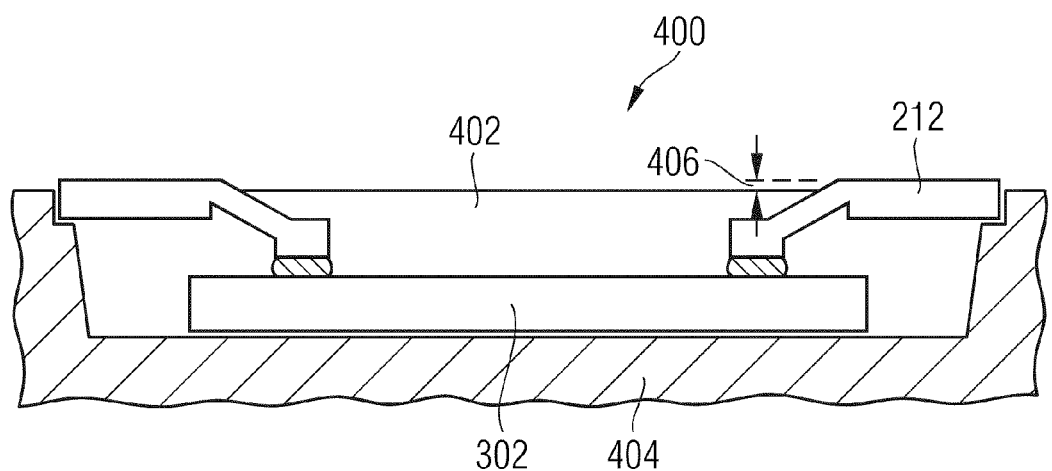
FIGS. 4A-4D are schematic diagrams of molding in FIG. 1.
Figure 4B:
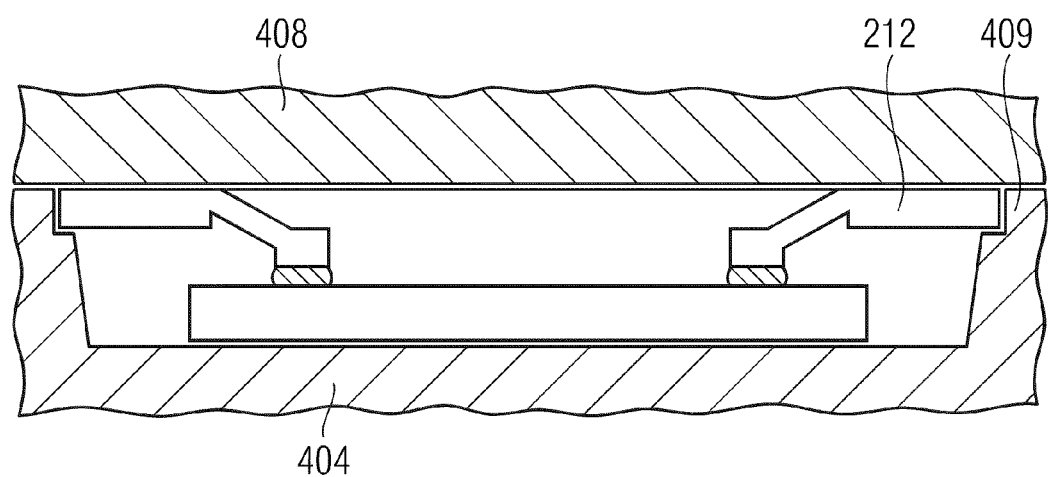
Figure 4C:
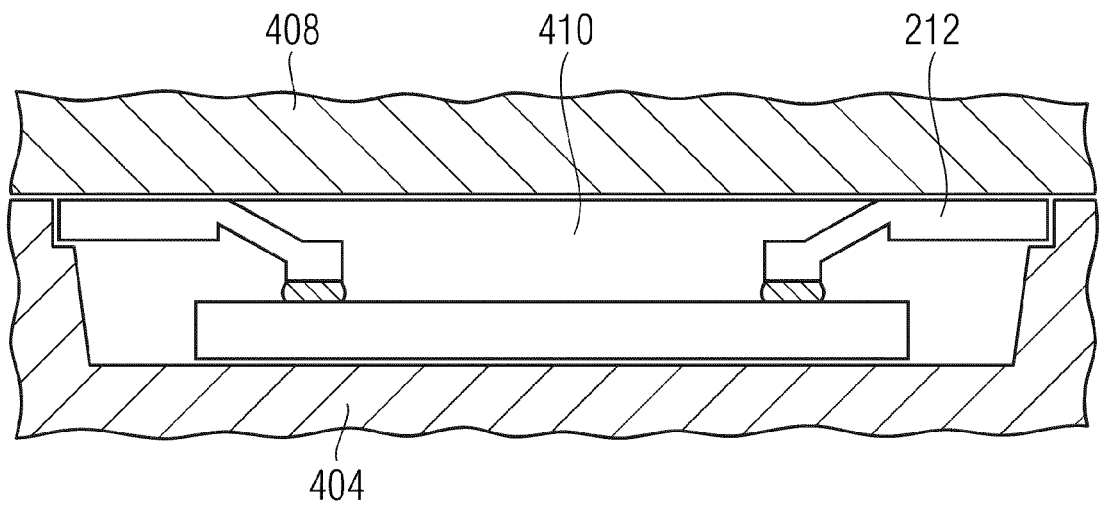
Figure 4D:
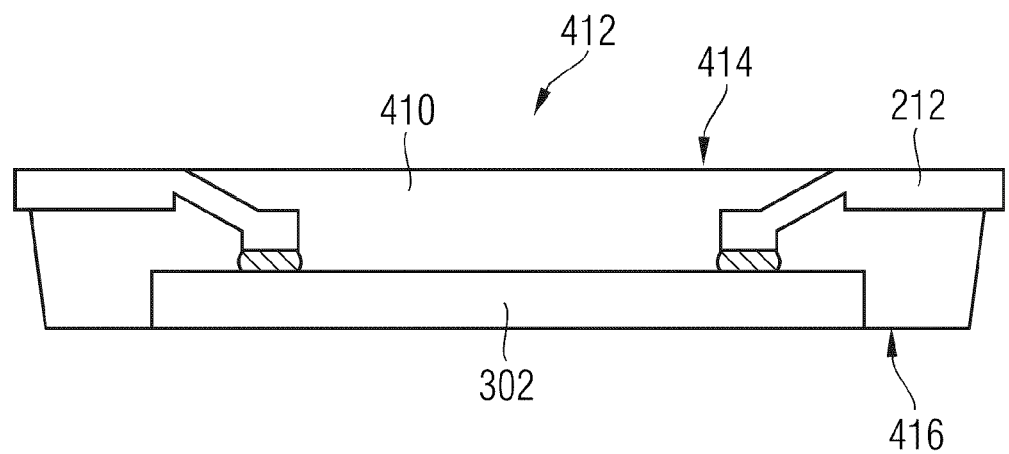
Figure 5A:
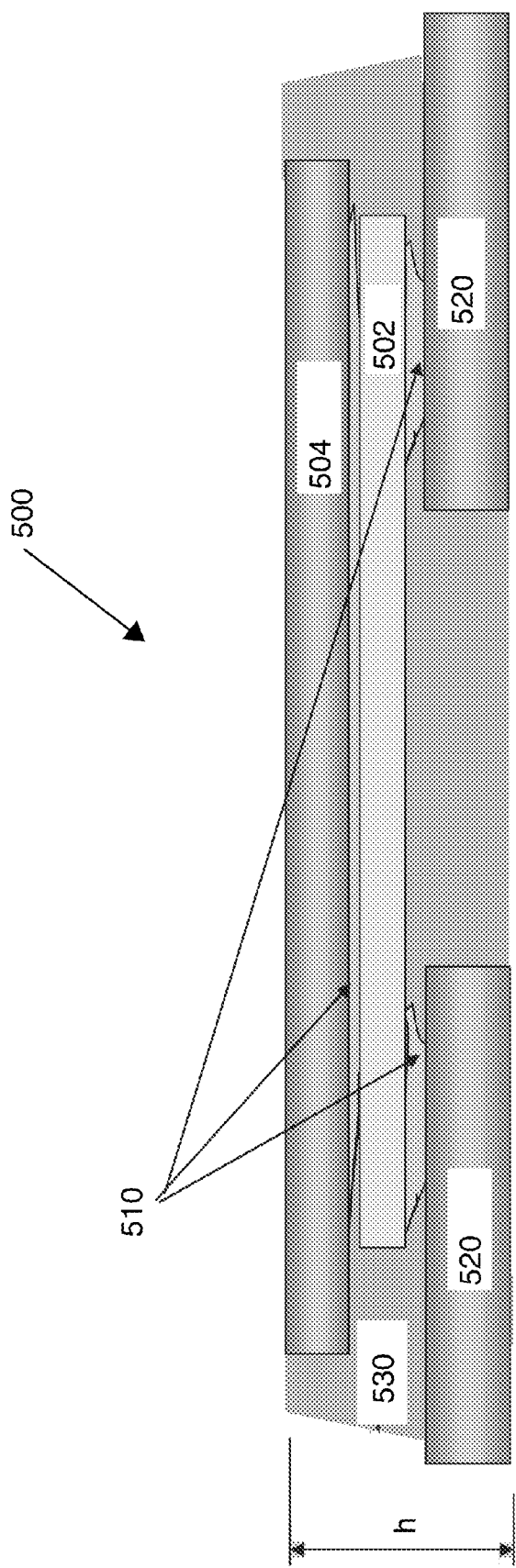
FIGS. 5A and 5B illustrate examples of conventional leadframe packages.
Figure 5B:
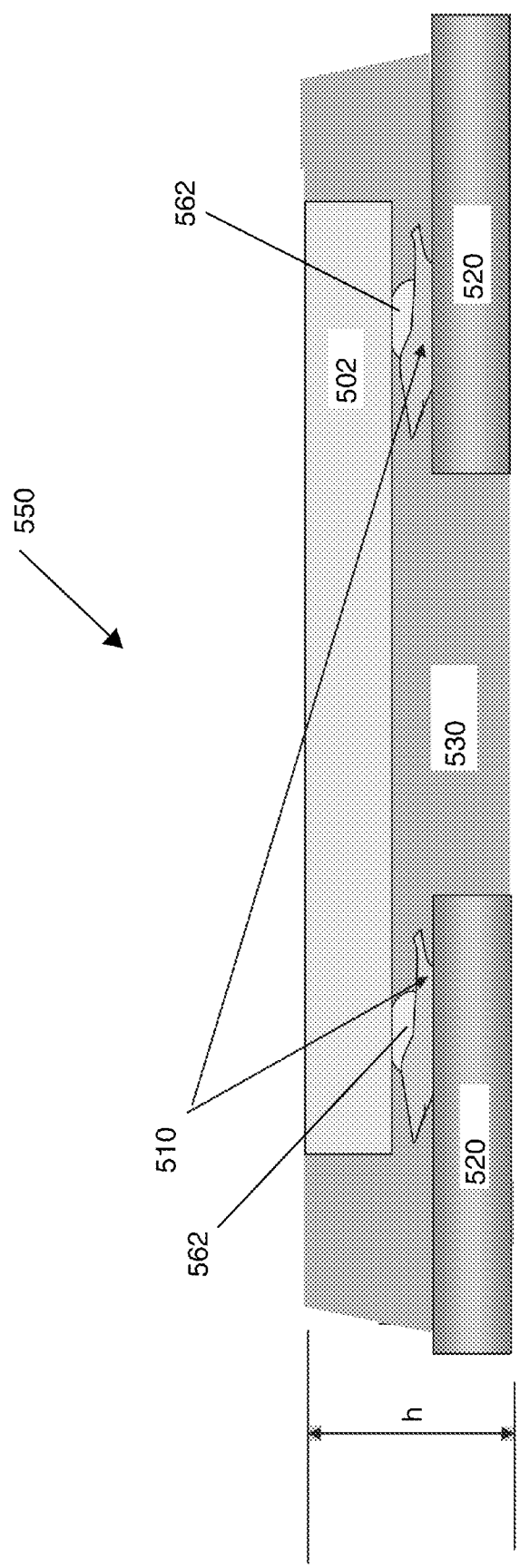

Leadframe compression 106 and molding 108 may be implemented according to the method shown in FIG. 4A. The molding apparatus 400 includes a lower mold 404 having a mold cavity 402, into which the directly bonded leadframe 212 and chip 302 are located. The height of the leadframe 212 is designed so that on average it has a portion 406 which protrudes above the top of the lower mold 404. For example, for a package height of 1 mm, the leadframe 212 may designed so that on average it protrudes by 3-10 μm. In FIG. 4B an upper mold 408 is seated against the lower mold 404 to seal the mold cavity 402. The upper mold 408 also compresses and/or flexes the protruding portion 406 of the leadframe 212, for example, by 3-10 μm, so that it is level with the top of the lower mold 404, and is retained within a shoulder 409 in the lower mold 404. In FIG. 4C the mold cavity 402 is filled with an encapsulant 410, for example, resin, to encapsulate the bonded leadframe 212 and chip 302. In FIG. 4D the mold apparatus is retracted leaving the package 412.

The package 412 may form the finished product or may be further processed to form a part of other products.

In an exemplary embodiment, the package 412 may comprise a leadframe 212 adjacent to a first face 414 of the package, having one or more leads, a semiconductor device 302 adjacent to a second face 416 of the package being opposite to the first face 414, the semiconductor device having one or more contacts, and one or more of the leads directly bonded to one or more of the contacts. This embodiment may have the advantage that the process of bonding is simplified, and/or the thickness of the bond is more uniform. This embodiment may be utilized by a method comprising electrically connecting a leadframe adjacent to a first face of a package to an external device, the leadframe having one or more leads, providing a semiconductor device at a second face of the package, being opposite to the first face, the semiconductor device including one or more contacts directly bonded to one or more of the leads.

In a further exemplary embodiment, the package 412 may comprise a semiconductor device 302, a leadframe 212 in an at least partially flexed and/or compressed state, and an encapsulant 410 at least partially encapsulating the semiconductor device and the leadframe in an at least partially flexed and/or compressed state. This embodiment may have the advantage that the thickness of the package prior to molding can be made uniform by flexing and/or compressing the leadframe. This may avoid mold flashes during encapsulation/molding. This embodiment may be utilized by a method providing a leadframe electrically connected to a semiconductor device in an at least partially flexed and/or compressed state, and electrically connecting the leadframe to an external device.

The skilled reader will appreciate that further steps can included prior, in or after the previously described methods.

Many variations of the above exemplary embodiments, are possible within the scope of the following claims, as will be clear to a skilled reader.

What is claimed is:

1. A method comprising:
   providing a leadframe comprising a chip contact portion and an external lead portion to electrically connect to an external device;
   providing a semiconductor device, the semiconductor device having at least one solder ball attached;
   directly bonding the solder ball to the chip contact portion;
   partially flexing and/or compressing a connecting portion of the leadframe, the connecting portion located between the chip contact portion and the external lead portion, wherein partially flexing and/or compressing comprises compressing in height by 3-10 µm; and
   at least partially encapsulating the semiconductor device and the flexed and/or compressed leadframe to form a dual sided cooling package.

2. The method of claim 1, wherein the connecting portion is angled, at between 10°-80° relative to a longitudinal axis of the chip contact portion or the external lead portion.

3. The method of claim 1 wherein the connecting portion has a region of reduced cross-section relative to the chip contact portion or the external lead portion.

4. The method of claim 3, wherein the connecting portion is half the cross-sectional region relative to the chip contact portion or the external lead portion.

5. The method of claim 1, further comprising forming the leadframe, wherein forming the leadframe comprises:
   etching a portion of the lead to form the connecting portion; and
   translating a first end to a spaced parallel axis to a second end.

6. A semiconductor package comprising:
   a semiconductor device;
   a leadframe comprising a chip contact portion, an external lead portion and a connecting portion, wherein the leadframe is in an at least partially flexed and/or compressed state along a direction normal to the chip contact portion and wherein the leadframe is displaced by 3-10 µm from its non-flexed and/or non-compressed state; and
   an encapsulant at least partially encapsulating the semiconductor device and the leadframe in an at least partially flexed and/or compressed state.

7. The semiconductor package of claim 6, further comprising at least one solder ball, wherein the at least one solder ball is in direct contact with the semiconductor device and the chip contact portion of the leadframe.

8. A method for manufacturing a semiconductor package, the method comprising:
   placing a leadframe electrically connected to a semiconductor device into a mold cavity of a molding apparatus, wherein an upper part of the leadframe extends beyond an upper part of the molding apparatus; and
   placing a closure mold on the molding apparatus thereby compressing the upper part of the leadframe to be substantially level with the upper part of the molding apparatus, wherein compressing the upper part of the leadframe to be substantially level with the upper part of the molding apparatus comprises a compression in height of about 3 µm to about 10 µm.

9. The method of claim 8, wherein the leadframe comprises a chip contact portion, an external lead portion and a connecting portion between the chip contact portion and the external lead portion.

10. The method of claim 9, wherein compressing the upper part of the leadframe comprises compressing the connecting portion.

11. The method of claim 9, wherein the connecting portion is angled, at between 10°-80° relative to a longitudinal axis of the chip contact portion or the external lead portion.

12. The method of claim 9, wherein the connecting portion has a region of reduced cross-section relative to the chip contact portion or the external lead portion.

13. The method of claim 12, wherein the connecting portion is half the cross-sectional region relative to the chip contact portion or the external lead portion.

14. The method of claim 8, wherein the leadframe is electrically connected to the semiconductor device by directly bonding the chip contact portion to a solder ball, and wherein the solder ball is arranged on the semiconductor device.

15. The method of claim 8, placing the leadframe into the mold cavity of the molding apparatus comprises placing the leadframe on a shoulder arranged along an upper part of the mold cavity.

16. The method of claim 8, further comprising filling the mold cavity with an encapsulant.

17. The method of claim 8, wherein the semiconductor package is a dual sided cooling package.

18. The semiconductor package of claim 6, wherein the connecting portion has a region of reduced cross-section relative to the chip contact portion or the external lead portion.

* * * * *